United States Patent
Nozoe (12) 
(10) Patent No.: US 8,461,697 B2
(45) Date of Patent: Jun. 11, 2013

(54) SEMICONDUCTOR INTEGRATED CIRCUIT DEVICE

(75) Inventor: Mitsushi Nozoe, Osaka (JP)

(73) Assignee: Panasonic Corporation, Osaka (JP)

(*) Notice: Subject to any disclaimer, the term of this patent is extended or adjusted under 35 U.S.C. 154(b) by 13 days.

(21) Appl. No.: 13/224,649

(22) Filed: Sep. 2, 2011

(65) Prior Publication Data

US 2011/0316174 A1    Dec. 29, 2011

Related U.S. Application Data

(63) Continuation of application No. PCT/JP2010/001101, filed on Feb. 19, 2010.

(30) Foreign Application Priority Data

Mar. 3, 2009   (JP) ................................. 2009-049030
Jul. 17, 2009   (JP) ..................... PCT/JP2009/003383

(51) Int. Cl.
    *H01L 23/48*    (2006.01)
(52) U.S. Cl.
    USPC .............. 257/786; 257/E23.015; 257/E23.02; 257/E23.079
(58) Field of Classification Search
    USPC .................. 257/786, E23.079, 202, 203, 772, 257/779, E23.015, E21.508, E21.509, E21.519, 257/E21.151–E21.153, E23.02, 23.015; 438/612–617
    See application file for complete search history.

(56) References Cited

U.S. PATENT DOCUMENTS

| | | | |
|---|---|---|---|
| 6,242,814 B1 * | 6/2001 | Bassett | 257/786 |
| 2003/0038377 A1 | 2/2003 | Nakata et al. | |
| 2003/0067066 A1 | 4/2003 | Kondou | |
| 2004/0006754 A1 | 1/2004 | Sonohara | |
| 2005/0056932 A1 * | 3/2005 | Shinjo | 257/737 |
| 2007/0085214 A1 | 4/2007 | Isa et al. | |
| 2008/0246500 A1 | 10/2008 | Chong et al. | |

FOREIGN PATENT DOCUMENTS

| | | |
|---|---|---|
| JP | 2003-68852 | 3/2003 |
| JP | 2003-124318 | 4/2003 |
| JP | 2004-47516 | 2/2004 |
| JP | 2005-142281 | 6/2005 |
| JP | 2007-95911 | 4/2007 |
| JP | 2008-533441 | 8/2008 |

* cited by examiner

*Primary Examiner* — Jasmine Clark
(74) *Attorney, Agent, or Firm* — McDermott Will & Emery LLP (57) ABSTRACT

In a semiconductor integrated circuit device, arrangement relationship of power source area I/O pads differs between a peripheral portion and a center portion of a gate region of a chip. That is, in two columns and two rows of the peripheral portion of the gate region, VDD area I/O pads connected to a high-voltage power source VDD and GND area I/O pads connected to a ground power source GND are alternately aligned and arranged both in a row direction and in a column direction. Moreover, in the center portion of the gate region, the same VDD area I/O pads or the same GND area I/O pads are successively aligned in the row direction, and the VDD area I/O pads and the GND area I/O pads are alternately aligned and arranged in the column direction.

11 Claims, 12 Drawing Sheets

SEMICONDUCTOR INTEGRATED CIRCUIT DEVICE

CROSS-REFERENCE TO RELATED APPLICATION

This is a continuation of PCT International Application PCT/JP2010/001101 filed on Feb. 19, 2010, which claims priority to Japanese Patent Application No. 2009-049030 filed on Mar. 3, 2009, and to PCT International Application PCT/JP2009/003383 filed on Jul. 17, 2009. The disclosures of these applications including the specifications, the drawings, and the claims are hereby incorporated by reference in their entirety.

BACKGROUND

The disclosure relates to semiconductor integrated circuit devices including area I/O pads laid out in a flip chip having multilayer interconnect layers and power source structures of the flip chip.

To design semiconductor integrated circuits, positions of peripheral I/O regions in which I/O cells are arranged and positions of gate regions in which standard cells or macros are arranged are predetermined. For example, the peripheral I/O regions are peripheral portions of chips serving as semiconductor integrated circuit devices, and the gate regions are center portions (inner portions) surrounded by the peripheral I/O regions. When the semiconductor integrated circuits are designed, the I/O cells, the standard cells, and the macros are designed and arranged in the inner portions of the predetermined peripheral I/O regions and the predetermined gate regions.

Figure 14:
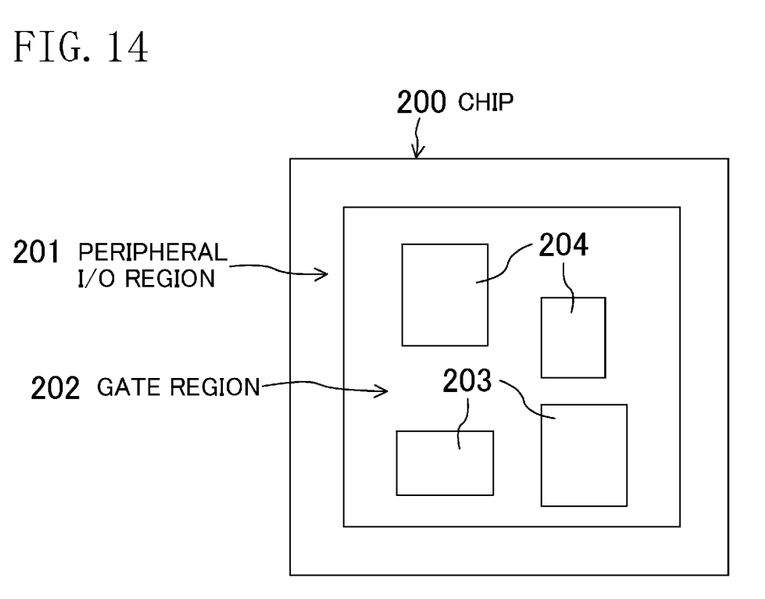
FIG. 14 is a view schematically illustrating an example configuration of a chip of a conventional semiconductor integrated circuit.

FIG. 14 is an overall view illustrating a chip serving as a semiconductor integrated circuit device. In the figure, a chip 200 includes a peripheral I/O region 201 and a gate region 202. Although not illustrated, I/O cells and ESD protection circuits are arranged in the peripheral I/O region 201. As illustrated in the figure, standard cells 203 and macros 204 are arranged in the gate region 202.

Moreover, the I/O cells and the ESD protection circuits are connected to I/O pads each of which is connected to signals input/output to/from the chip 200 or a power source. The I/O pads connected to the power sources are hereinafter referred to as power source I/O pads. The I/O pads connected to the signals are hereinafter referred to as signal I/O pads. When it is not particularly necessary to distinguish the power source I/O pads from the signal I/O pads, they are simply referred to as I/O pads.

Conventionally, the I/O pads are arranged in the peripheral I/O region. In the semiconductor integrated circuit device including such I/O pads, the number of I/O pads increases as the number of signals input/output to/from the chip 200 increases, so that it is necessary to increase the length of chip sides. Here, since the area of the gate region increases as the length of the chip sides increases, there is a concern that dead space in the gate region may increase depending on the gate size. Moreover, when the length of the chip sides increases, the distance from the power source I/O pads arranged in the peripheral I/O region, which is a peripheral portion of the chip, to a center portion of the chip increases. As a result, the resistance value of an interconnect extending from each power source I/O pad to the center portion of the chip increases, thereby increasing the voltage drop. When the voltage drop increases, a voltage supplied to the inner portion of the chip decreases, which may reduce the working speed.

As a technique related to improving the capacity to supply power to the inner portion of the chip, a flip-chip package is used.

With the flip-chip package, the number of signal terminals can be increased, a power source plane can be provided on an intermediate substrate which is referred to as a build-up substrate and connects a package to the chip, and the power source I/O pads can be arranged any positions of the inner portion of the chip, so that it is possible to improve the capacity to supply power to the inner portion of the chip.

Figure 15:
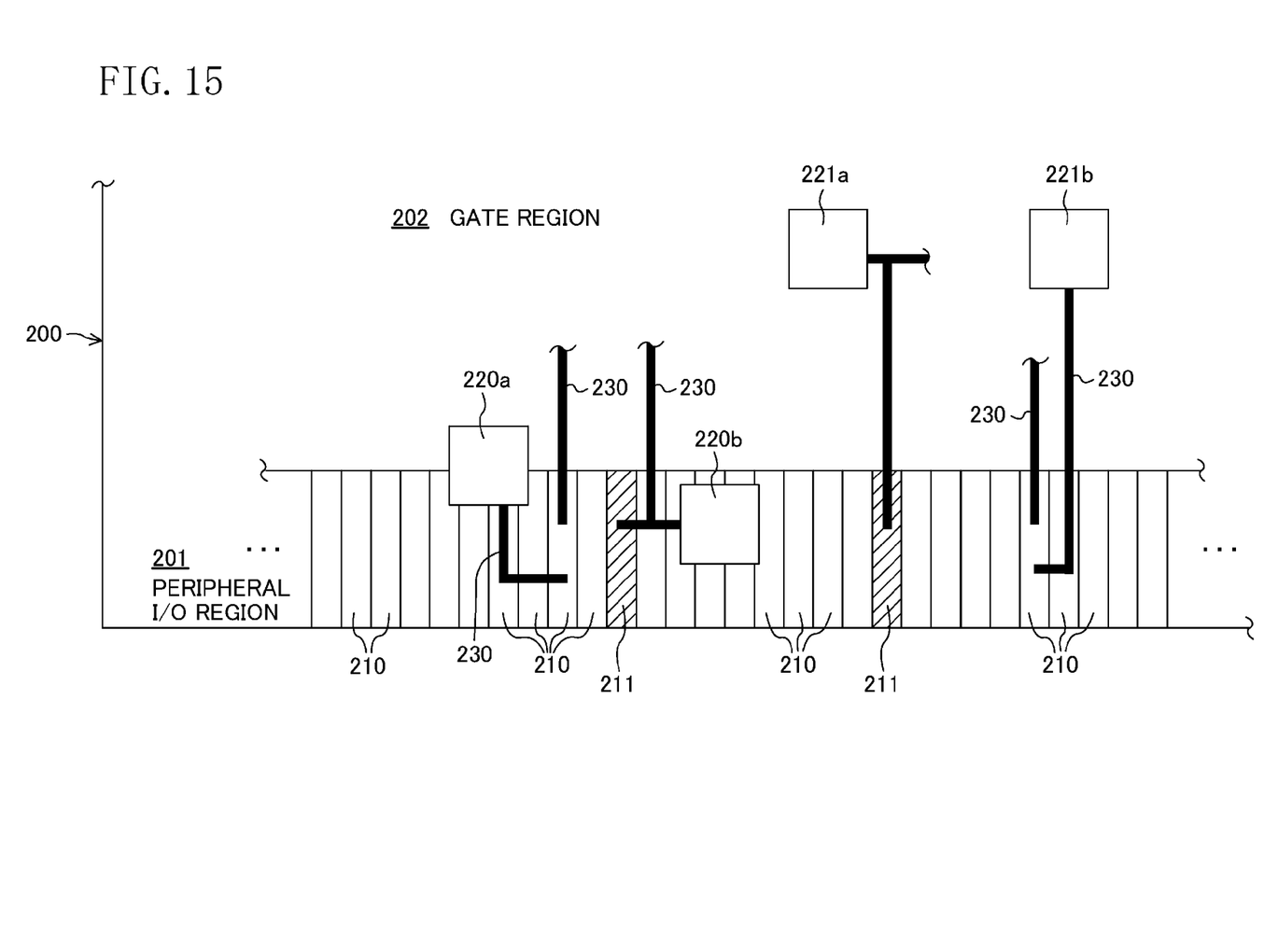
FIG. 15 is a view illustrating an example of a part in the vicinity of a peripheral I/O region of the chip of FIG. 14.

FIG. 15 illustrates an example configuration in the vicinity of the I/O pads. FIG. 15 is an enlarged view illustrating a part of the peripheral I/O region 201 of FIG. 14.

A plurality of I/O cells 210 and ESD protection circuits 211 are arranged in the peripheral I/O region 201, which is the peripheral portion of the chip 200. The standard cells and macro cells, which are not shown, are arranged in the gate region 202, which is the inner portion of the chip 200, where the standard cells and the macro cells are in the same layer as the plurality of I/O cells 210.

I/O pads 220a, 220b, 221a, 221b, which are illustrated as squares in FIG. 15 are arranged in a layer different from the layer in which the standard cells and the I/O cells are arranged. When viewed from above, the I/O pads 220a, 220b at least part of which overlaps the peripheral I/O region 201 are referred to as peripheral I/O pads, and the I/O pads which do not overlap the peripheral I/O region 201, that is, the I/O pads 221a, 221b arranged in the gate region 202 are referred to as area I/O pads.

The I/O pads 220a, 221b for digital signals are, as illustrated in the figure, connected to, for example, the standard cells in the gate region 202, which is the inner portion of the chip 200, via the I/O cells 210 and interconnects 230. The I/O pads 220b, 221a for analog signals such as power sources are, as illustrated in the figure, connected to the ESD protection circuits 211, and are connected to, for example, the standard cells in the gate region 202, which is the inner portion of the chip 200, via interconnects 230.

Note that FIG. 15 illustrates an example, and the I/O pads are not necessarily connected to the I/O cells or the ESD protection circuits.

The area I/O pads connected to the power sources are hereinafter referred to as power source area I/O pads, the area I/O pads connected to the signals are hereinafter referred to as signal area I/O pads, the peripheral I/O pads connected to the power sources are hereinafter referred to as power source peripheral I/O pads, and the peripheral I/O pads connected to the signals are hereinafter referred to as signal peripheral I/O pads. When it is not particularly necessary to distinguish these I/O pads from one another, they are simply referred to as area I/O pads, peripheral I/O pads, I/O pads.

Examples of an area I/O pad layout of a flip chip and a power source structure are described, for example, in Japanese Patent Publication No. 2003-068852, Japanese Patent Publication No. 2003-124318, and Japanese Patent Publication No. 2004-047516.

Figure 1:
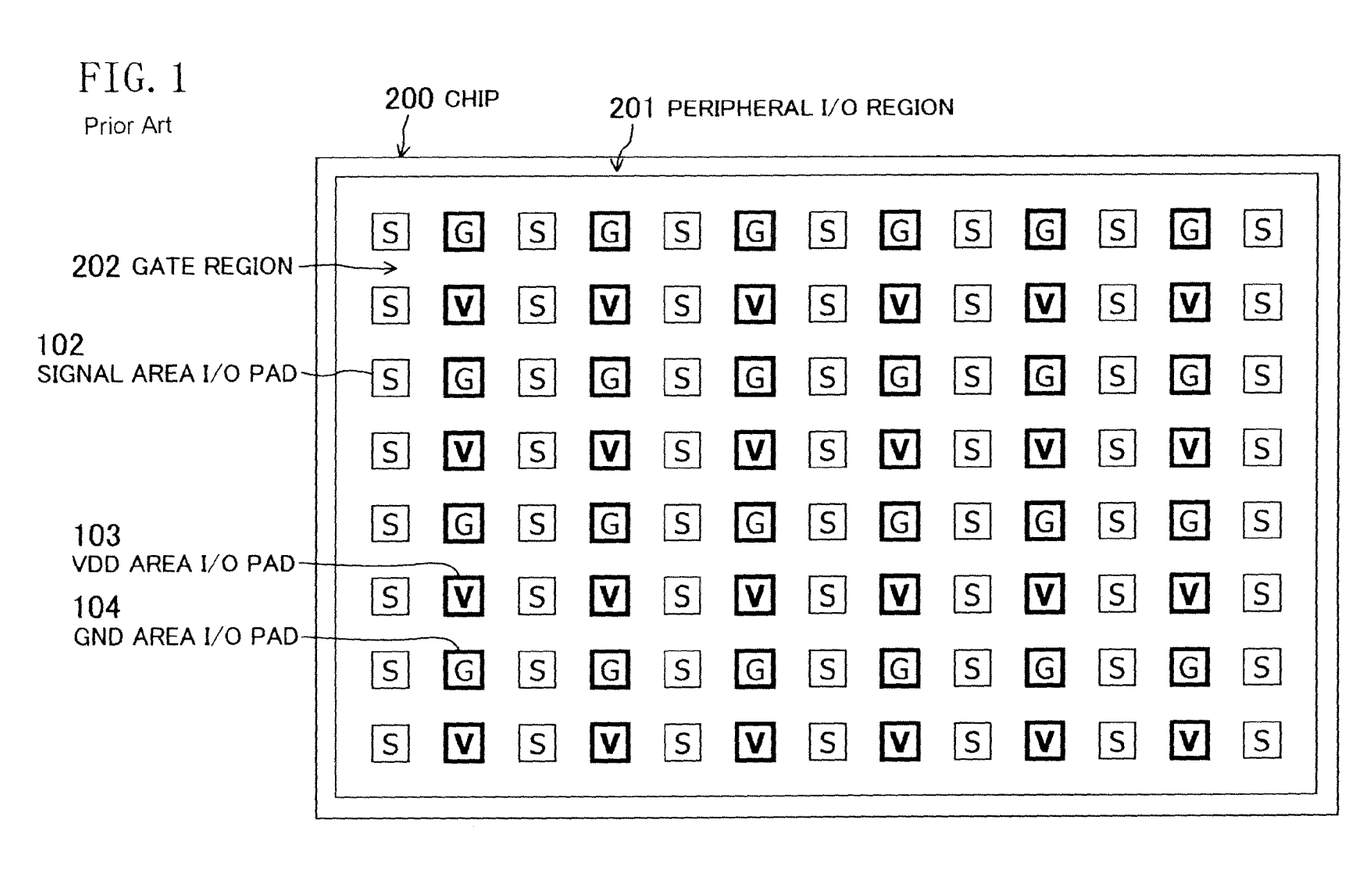
FIG. 1 is a view illustrating an example of a conventional power source area I/O pad layout.

As one of these examples, a conventional area I/O pad layout is illustrated in FIG. 1. A chip 200 of FIG. 1 includes three types of area I/O pads, that is, signal area I/O pads (S symbols in the figure) 102, VDD area I/O pads (V symbols in the figure) 103 serving as power source area I/O pads connected to a predetermined power source VDD, GND area I/O pads (G symbols in the figure) 104 serving as power source area I/O pads connected to a ground power source GND arranged in a region surrounded by a peripheral I/O region 201, that is, in a gate region 202 at an inner portion of the chip 200. The VDD area I/O pads 103 and the GND area I/O pads 104 are included in the power source area I/O pads. The present application describes the arrangement of the power source area I/O pads and the voltage drop, and thus hereinafter only the power source area I/O pads are described.

Figure 2:
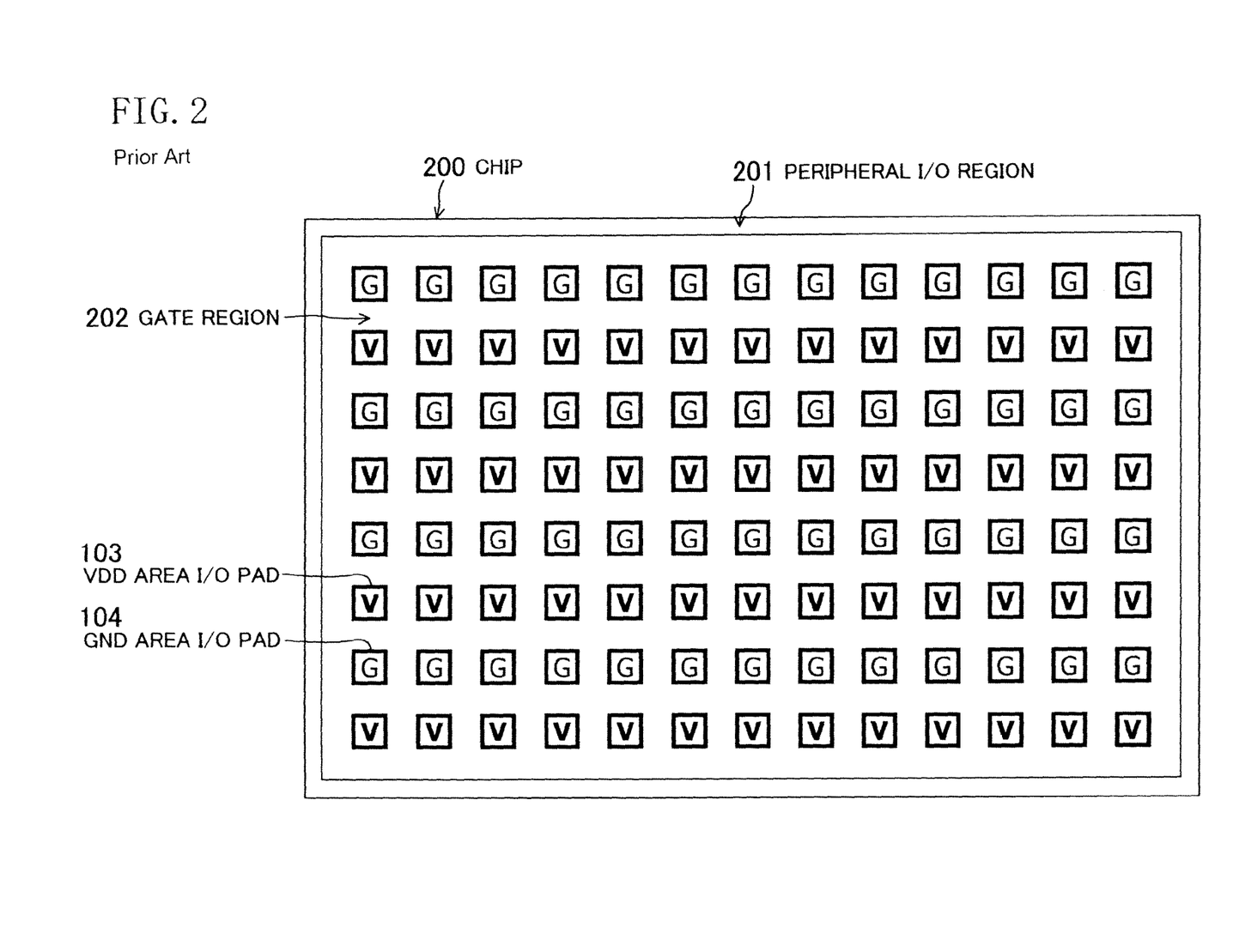
FIG. 2 is a view illustrating another example of the conventional power source area I/O pad layout.

FIG. 2 is a view focusing on the layout of only the power source area I/O pads 103, 104 of FIG. 1. The layout of FIG. 2 is similar to the area I/O pad layout of Japanese Patent Publication No. 2004-047516. That is, the layout is such that the same power source area I/O pads are aligned in a row direction, and different power source area I/O pads are alternately aligned in a column direction. The VDD area I/O pads 103 or the GND area I/O pads 104 are successively aligned in the row direction, and the VDD area I/O pads 103 and the GND area I/O pads 104 are alternately aligned in the column direction.

Figure 3:
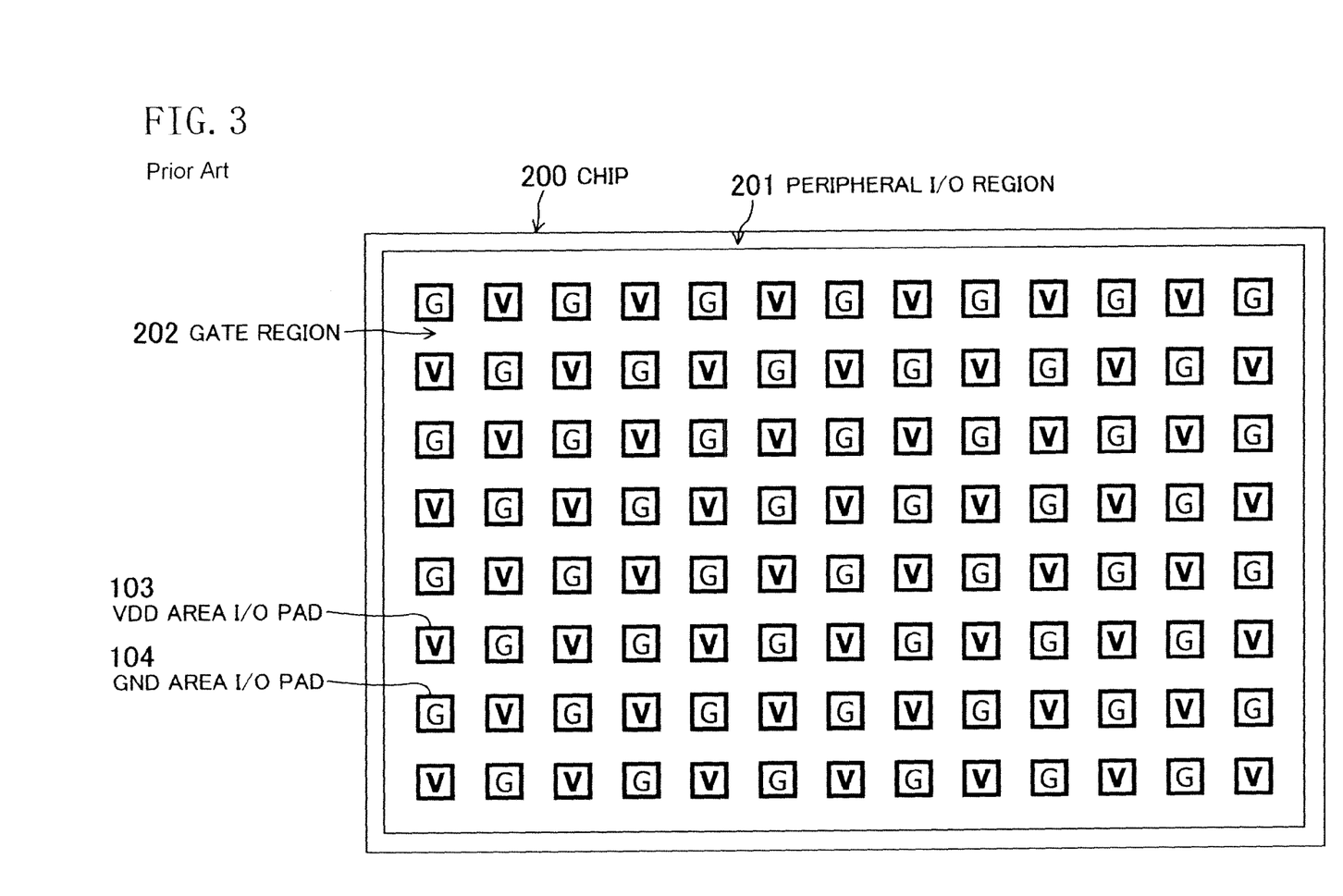
FIG. 3 is a view illustrating still another example of the conventional power source area I/O pad layout.

FIG. 3 illustrates another layout of power source area I/O pads. In the figure, different power source area I/O pads are alternately aligned both in the row direction and in the column direction. That is, VDD area I/O pads 103 and GND area I/O pads 104 are alternately aligned both in the row direction and in the column direction. This layout is similar to the area I/O pad layout of Japanese Patent Publication No. 2003-124318.

Note that there are several types of semiconductor integrated circuit devices depending on their applications, and examples the types are (1) semiconductor integrated circuit devices provided with peripheral I/O pads but without area I/O pads, (2) semiconductor integrated circuit devices provided with peripheral I/O pads and area I/O pads, and (3) semiconductor integrated circuit devices provided with area I/O pads but without peripheral I/O pads.

SUMMARY

However, the power source area I/O pad layouts of FIGS. 2, 3 each include a portion where power supply is insufficient, and the voltage drop is not optimal. This will be described in detail below.

Figure 4:
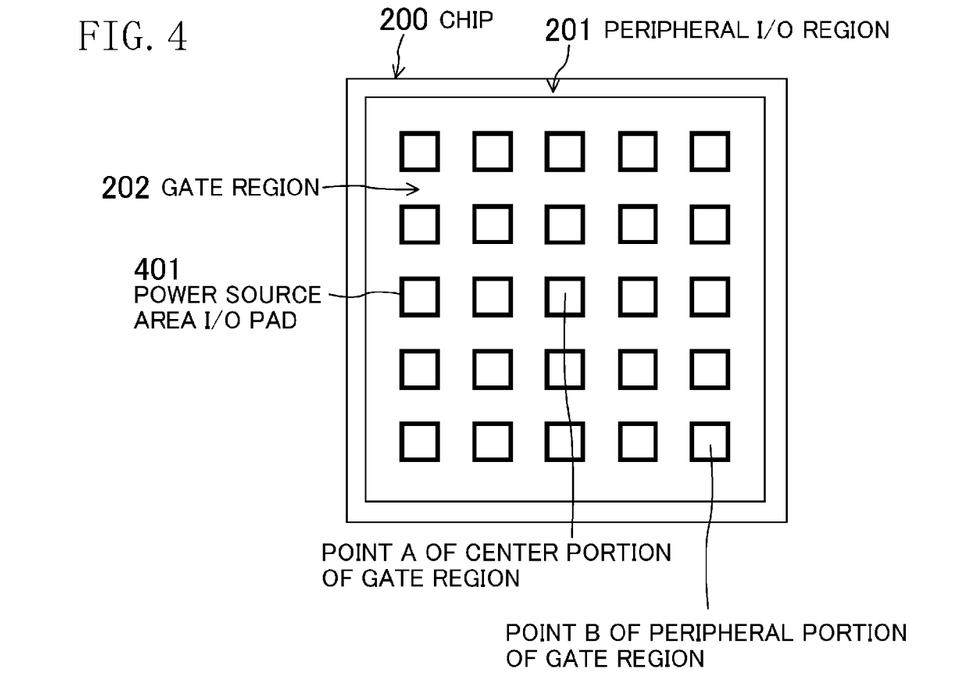
FIG. 4 is a view illustrating an example of a power source area I/O pad layout.

The voltage drops in the case of the power source area I/O pad layouts of FIGS. 2, 3 will be described. As illustrated in FIG. 4, with respect to a point A of a center portion of the gate region 202 of the chip 200 and a point B of a peripheral portion of the gate region 202, the case where power source area I/O pads 103 are arranged as illustrated in FIG. 2 is compared with the case where the power source area I/O pads 103 are arranged as illustrated in FIG. 3.

The influence of the voltage drop is determined by a drop of a VDD voltage and an increase of a GND voltage. Thus, a resistance from a VDD power source and a resistance from a GND power source are obtained, and the obtained resistances are compared with each other.

Figure 5:
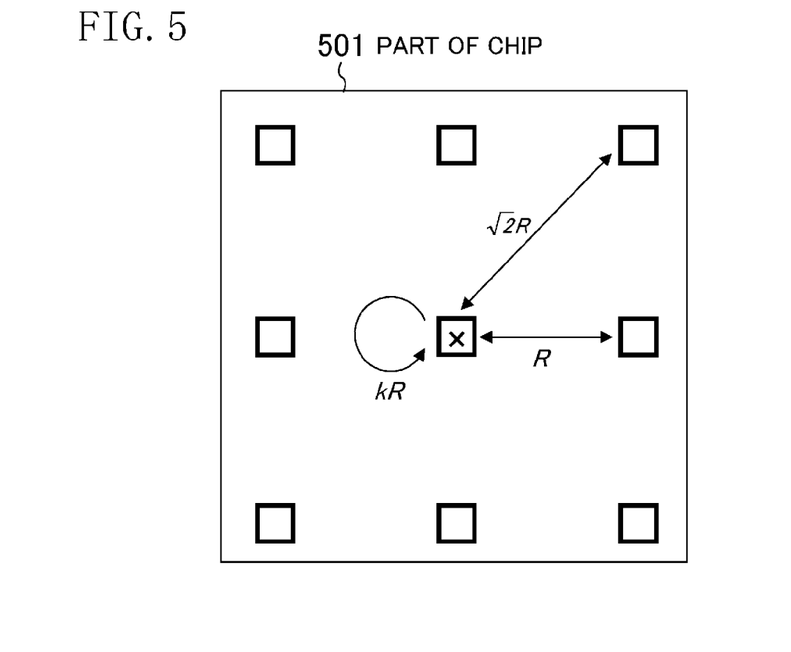
FIG. 5 is a view illustrating the computation of the resistance from each of power source area I/O pads.

First, with reference to FIG. 5, the resistance from each power source area I/O pad to a center point x in a part 501 of the chip is considered. It is provided that the power source area I/O pads are arranged at regular intervals, and the resistance from a power source area I/O pad adjacent to the right of the point x is R. Here, the resistance value is proportional to the distance, and thus the resistance from a power source area I/O pad arranged at a diagonally upper-right position relative to the point x is $\sqrt{2}R$. Moreover, the resistance from a power source area I/O pad arranged at a position immediately above the point x is kR (k>0). When the distance between interconnect layers is much smaller than the distance between the power source area I/O pads, k<<1.

Figure 6A:
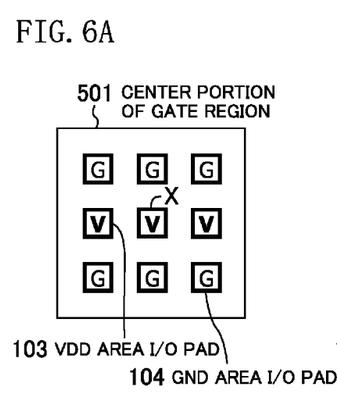
FIG. 6A is an enlarged view illustrating a center portion of a chip of the power source area I/O pad layout of FIG. 2.
Figure 6B:
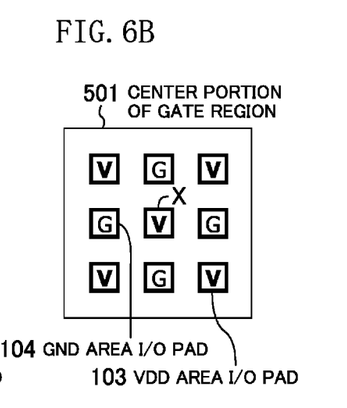
FIG. 6B is an enlarged view illustrating a center portion of a chip the power source area I/O pad layout of FIG. 3.

Next, with reference to FIGS. 6A, 6B, with respect to the point A of the center portion of the chip 200 of FIG. 4, a resistance from the VDD power source and a resistance from the GND power source are obtained in the case of the power source area I/O pad layout of FIG. 2 and in the case of the power source area I/O pad layout of FIG. 3.

FIG. 6A is an enlarged view at the point A of the center portion of the chip of FIG. 4, where the power source area I/O pads are arranged as illustrated in FIG. 2. FIG. 6B is an enlarged view at the point A of the center portion of the chip of FIG. 4, where the power source area I/O pads are arranged as illustrated in FIG. 3.

In FIG. 6A, with respect to a point indicated by the symbol X in the center portion 501 of the chip, resistances from other VDD area I/O pads 103 are summed into a combined resistance which is a total of three resistances from two VDD area I/O pads 103 arranged on the left and right of the point X and a VDD area I/O pad 103 arranged directly above the point X. Since resistance values of the three resistances are R, R, and kR, respectively, the combined resistance from the VDD area I/O pads 103 is $\{k/(2k+1)\} \cdot R$. Likewise, the combined resistance from the GND area I/O pads 104 is $\{\sqrt{2}/2(2+\sqrt{2})\} \cdot R$.

Likewise, in FIG. 6B, with respect to a point indicated by the symbol X in the center portion 501 of the chip, the combined resistance from the VDD area I/O pads 103 is $\{\sqrt{2}\sqrt{k}/(4 \cdot k+\sqrt{2})\} \cdot R$, and the combined resistance from the GND area I/O pads 104 is $(1/4) \cdot R$.

Thus, in FIG. 6A, the sum of the resistances from the VDD area I/O pads 103 and from the GND area I/O pads 104 is indicated by Expression (1). Moreover, in FIG. 6B, the sum of the resistances from the VDD area I/O pads 103 and from the GND area I/O pads 104 is indicated by Expression (2).

[Expression 1]

$$\{(k/(2k+1))+(\sqrt{2}/(2(2+\sqrt{2})))\}R \quad (1)$$

[Expression 2]

$$\{\sqrt{2}k/(4k+\sqrt{2}))+(1/4)\}R \quad (2)$$

Figure 7:
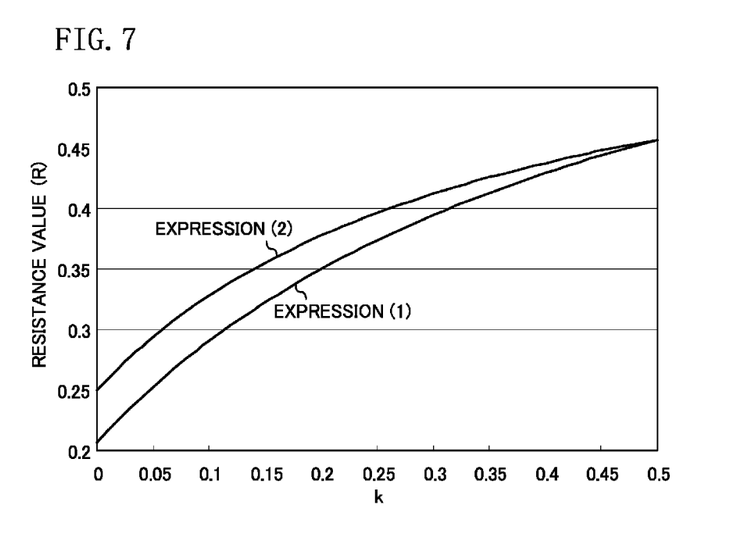
FIG. 7 is a graph illustrating resistance values at the center portions of the chips of the power source area I/O pad layouts of FIGS. 2, 3.

FIG. 7 is a graph of Expressions (1) and (2) in the range 0<k<0.5. As can be seen from the graph, in the range 0<k<<1, a smaller value is derived from Expression (1). That is, at the center portion of the chip, the resistance is smaller, and the voltage drop is smaller in the case of the power source area I/O pad layout of FIG. 2 than in the case of the power source area I/O pad layout of FIG. 3.

Figure 8A:
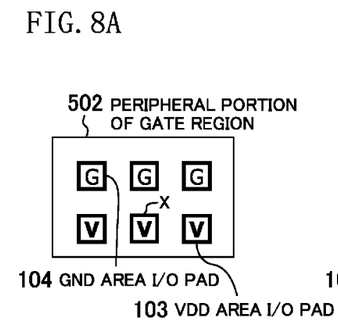
FIG. 8A is an enlarged view illustrating a peripheral portion of a gate region of the power source area I/O pad layout of FIG. 2.
Figure 8B:
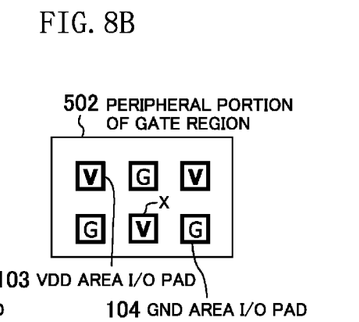
FIG. 8B is an enlarged view illustrating a peripheral portion of a gate region of the power source area I/O pad layout of FIG. 3.

Next, with reference to FIGS. 8A, 8B, with respect to the point B of the peripheral portion of the gate region 202 of the chip 200 of FIG. 4, a resistance from the VDD power source and a resistance from the GND power source are obtained in the case of the power source area I/O pad layout of FIG. 2 and in the case of the power source area I/O pad layout of FIG. 3.

FIG. 8A is an enlarged view at the point B of the peripheral portion of the gate region 202 of the chip 200 of FIG. 4, where the power source area I/O pads are arranged as illustrated in FIG. 2. FIG. 8B is an enlarged view at the point B of the peripheral portion of the gate region of FIG. 4, where the power source area I/O pads are arranged as illustrated in FIG. 3. In FIGS. 8A, 8B, a portion in the vicinity of a lower side of the chip is illustrated as a peripheral portion 502 of the chip, and the lower side in the figures is a lower side of the gate region 202.

In FIG. 8A, with respect to a point indicated by the symbol X in the peripheral portion 502 of the chip, resistances from other VDD area I/O pads 103 are summed into a combined resistance which is a total of three resistances from two VDD area I/O pads 103 arranged on the left and right of the point X and a VDD area I/O pad 103 arranged directly above the point X. Since resistance values of the three resistances are R, R, and kR, respectively, the combined resistance from the VDD area I/O pads 103 is $\{k/(2\cdot k+1)\}\cdot R$. Likewise, the combined resistance from the GND area I/O pads 104 is $\{1/(1+\sqrt{2})\}\cdot R$.

Likewise, in FIG. 8B, at the peripheral portion 502 of the gate region, the combined resistance from the VDD area I/O pads 103 is $\{k/(\sqrt{2}\cdot k+1)\}\cdot R$, and the combined resistance from the GND area I/O pads 104 is $(1/3)\cdot R$.

Thus, in FIG. 8A, the sum of the resistances from the VDD area I/O pads 103 and from the GND area I/O pads 104 is indicated by Expression (3). Moreover, in FIG. 8B, the sum of the resistances from the VDD area I/O pads 103 and from the GND area I/O pads 104 is indicated by Expression (4).

[Expression 3]

$$\{(k/(2k+1))+(1/(1+\sqrt{2}))\}R \quad (3)$$

[Expression 4]

$$\{(k/(\sqrt{2}k+1))+(1/3)\}R \quad (4)$$

Figure 9:
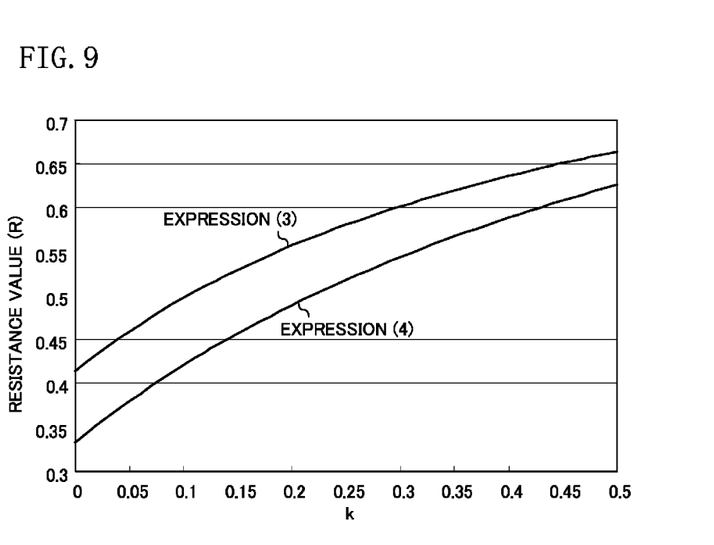
FIG. 9 is a graph illustrating resistance values at the peripheral portions of the gate regions of the power source area I/O pad layouts of FIGS. 2, 3.

FIG. 9 is a graph of Expressions (3) and (4) in the range $0<k<0.5$. As can be seen from the graph, in the range $0<k\ll 1$, a smaller value is derived from Expression (4). That is, at the peripheral portion 502 of the chip, the resistance is smaller, and the voltage drop is smaller in the case of the power source area I/O pad layout of FIG. 3 than in the case of the power source area I/O pad layout of FIG. 2.

As described above, in the power source area I/O pad layouts of FIGS. 2 and 3, a problem arises that the voltage drop depends on positions in the gate region 202 and cannot be minimized.

A semiconductor integrated circuit device of the present invention was devised to solve the problems discussed above. The detailed description describes implementations of a layout of area I/O pads and power source area I/O pads which differs between the center portion and the peripheral portion of the gate region of the chip so that the voltage drop depending on positions in the gate region is reduced.

Specifically, an example semiconductor integrated circuit device of the present invention includes: a peripheral I/O region in which I/O cells are arranged; a gate region surrounded by the peripheral I/O region; a plurality of area I/O pads arranged in the gate region; and at least first and second power sources, wherein the plurality of area I/O pads include area I/O pads connected to the first power source, and area I/O pads connected to the second power source, and arrangement relationship among the area I/O pads connected to the first power source and the area I/O pads connected to the second power source differs between a center portion and a peripheral portion of the gate region.

In the example semiconductor integrated circuit device of the present invention, the area I/O pads connected to the first power source and the area I/O pads connected to the second power source are alternately arranged only in a row direction or only in a column direction in the center portion of the gate region.

In the example semiconductor integrated circuit device of the present invention, the area I/O pads connected to the first power source and the area I/O pads connected to the second power source are alternately arranged both in a row direction and in a column direction in the peripheral portion of the gate region.

In the example semiconductor integrated circuit device of the present invention, the area I/O pads connected to the first power source and the area I/O pads connected to the second power source are alternately arranged, in at least two rows or two columns, both in a row direction and in a column direction in the peripheral portion of the gate region.

In the example semiconductor integrated circuit device of the present invention, the first power source is a high-voltage power source, and the second power source is a ground power source.

In the example semiconductor integrated circuit device of the present invention, the plurality of area I/O pads include area I/O pads connected to a third power source, and arrangement relationship among the area I/O pads connected to the first power source, the area I/O pads connected to the second power source, and the area I/O pads connected to the third power source differs between the peripheral portion and the center portion of the gate region.

In the example semiconductor integrated circuit device of the present invention, the area I/O pads connected to the third power source are provided in either one of the center portion or the peripheral portion of the gate region.

In the example semiconductor integrated circuit device of the present invention further includes: a plurality of peripheral I/O pads arranged in the peripheral I/O region.

Thus, in the present invention, the layout of the power source area I/O pads differs between the center portion and the peripheral portion of the gate region of the chip. For example, the layout of the power source area I/O pads differs between the center portion and the peripheral portion of the gate region of the chip such that the area I/O pad layout of FIG. 2 is used in the center portion of the gate region of the chip, and the area I/O pad layout of FIG. 3 is used in the peripheral portion of the gate region of the chip, so that voltage drops can effectively be reduced both in the center portion and the peripheral portion of the gate region of the chip.

As described above, the semiconductor integrated circuit device of the present invention has a layout of the power source area I/O pads which differs between the center portion and the peripheral portion of the gate region of the chip, so that it is possible to prevent locally-increased voltage drops on the chip.

DETAILED DESCRIPTION

First Embodiment

A first embodiment of the present invention will be described below with reference to the drawings.

Figure 10:
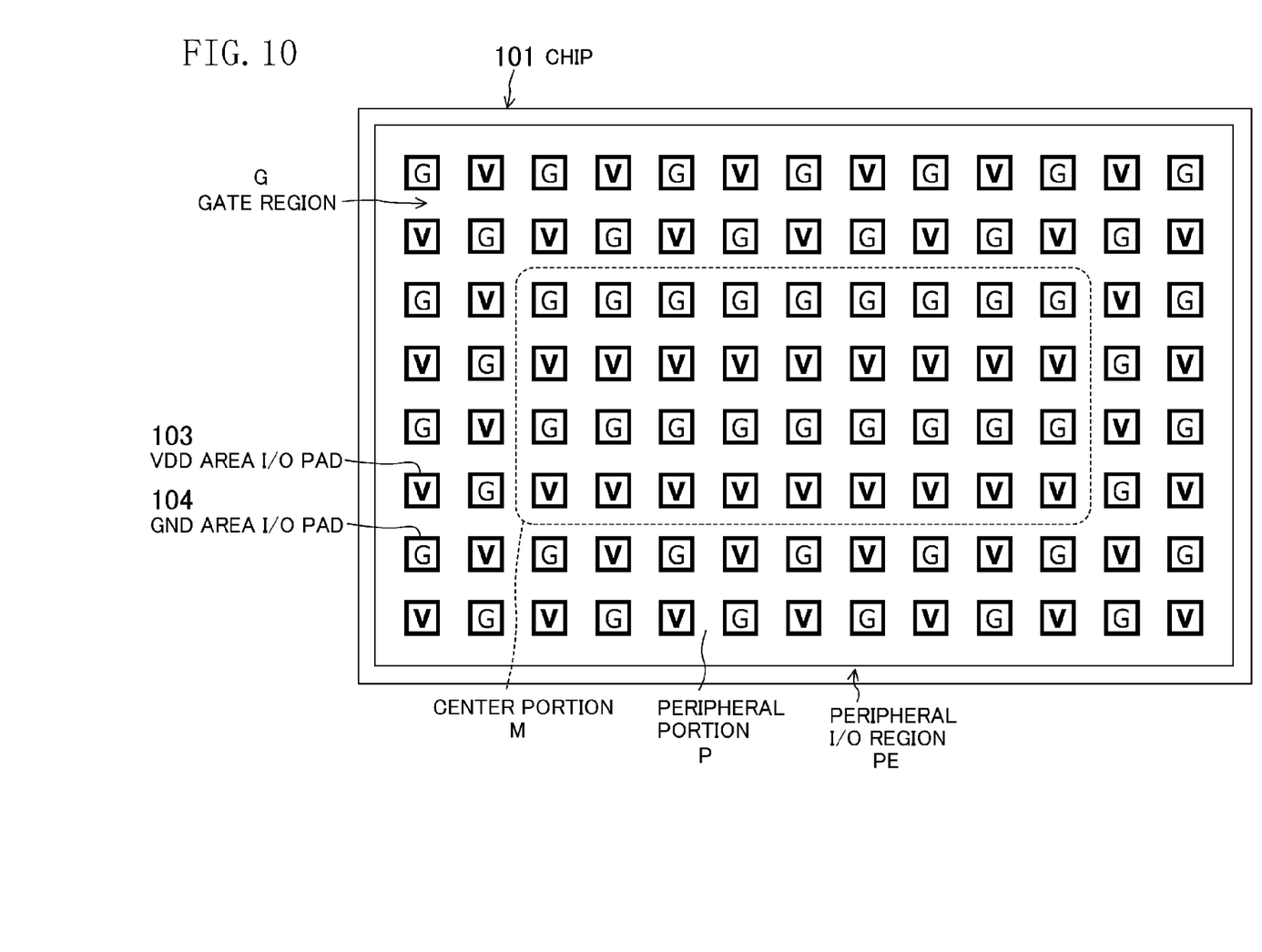
FIG. 10 is a view illustrating a power source area I/O pad layout of a first embodiment of a semiconductor integrated circuit device of the present invention.

FIG. 10 is a view illustrating the first embodiment of an area I/O pad layout of a semiconductor integrated circuit device of the present invention. Here, attention is directed to the arrangement of power source area I/O pads, and thus signal area I/O pads are not illustrated in the figure.

A power source area I/O pad layout illustrated in FIG. 10 will be described. As illustrated in the figure, in a region surrounded by a peripheral I/O region PE at the periphery of a chip 101, that is, in a gate region G located at an inner portion of the chip 101, different power source area I/O pads are alternately aligned, in two columns and two rows, both in a row direction and in a column direction in a peripheral portion P of the gate region G. That is, both in the row direction and in the column direction, VDD area I/O pads 103 connected to a high-voltage power source VDD serving as a first power source and GND area I/O pads 104 connected to a ground power source GND serving as a second power source are alternately aligned. Moreover, a layout in a center portion M of the gate region G of the chip 101, that is, in portions of the gate region G except for the peripheral portion P is such that the same power source area I/O pads are aligned in the row direction, and different power source area I/O pads are alternately aligned in the column direction. That is, the VDD area I/O pads 103 or the GND area I/O pads 104 are successively aligned in the row direction, and the VDD area I/O pads 103 and the GND area I/O pads 104 are alternately aligned in the column direction.

With this power source area I/O pad layout, as also described above, the area I/O pad layout of FIG. 2 is used in the center portion M of the gate region G, and thus the voltage drop can be reduced in the center portion M, and the area I/O pad layout of FIG. 3 is used in the peripheral portion P of the gate region G, and thus the voltage drop can be reduced in the peripheral portion P.

Although the peripheral portion P of the gate region G in the example of FIG. 10 includes two columns and two rows, the number of columns and/or the number of rows in the peripheral portion P of the gate region G can be changed if the layout is changed so that the voltage drops across the peripheral portion P and the center portion M of the gate region G are optimally reduced.

Second Embodiment

A second embodiment of the present invention will be described below with reference to the drawings.

Figure 11:
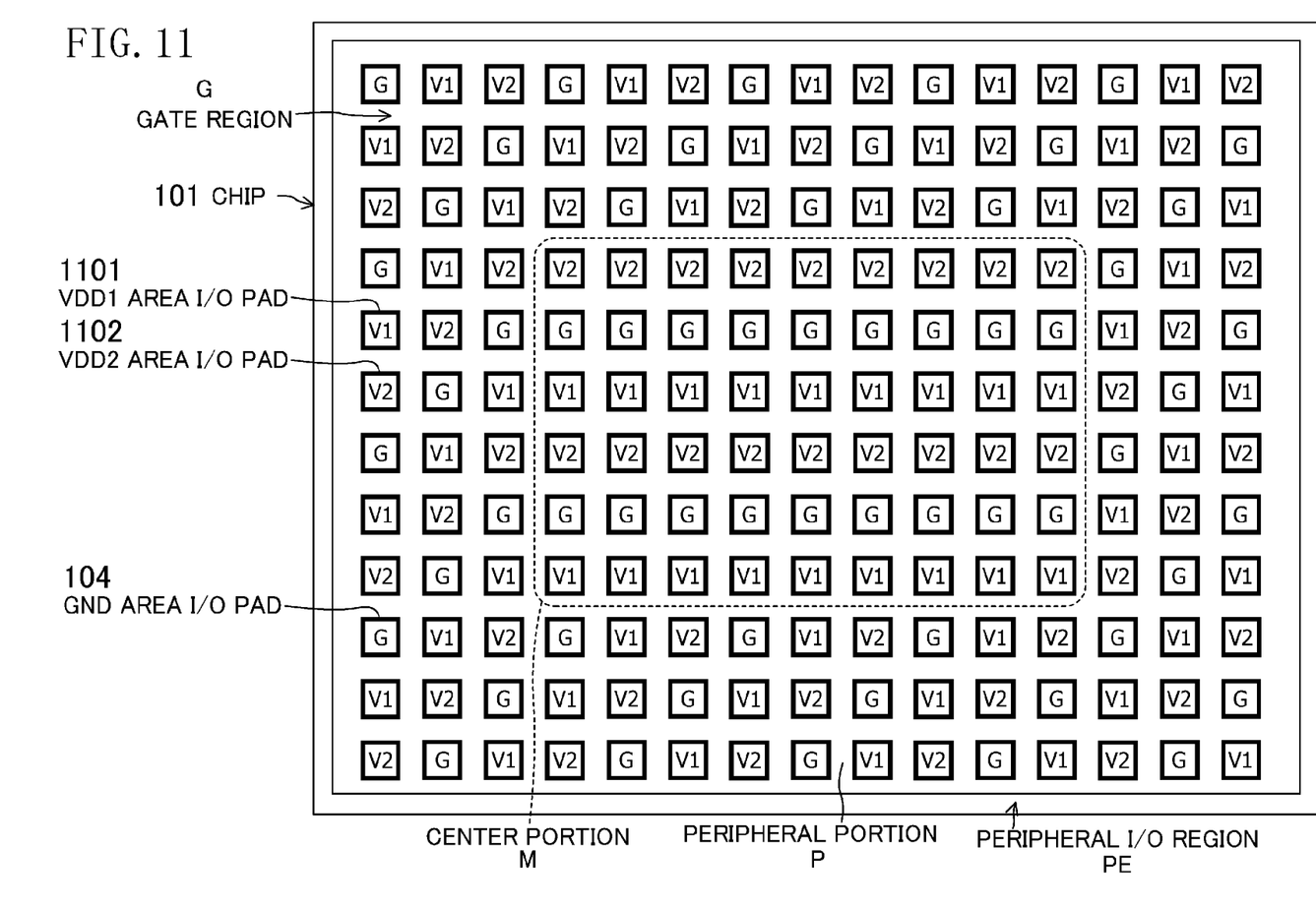
FIG. 11 is a view illustrating a power source area I/O pad layout of a second embodiment of the semiconductor integrated circuit device of the present invention.

FIG. 11 is a view illustrating the second embodiment of an area I/O pad layout of a semiconductor integrated circuit device of the present invention. Here, attention is directed to the arrangement of power source area I/O pads, and thus signal area I/O pads are not illustrated in the figure.

A power source area I/O pad layout illustrated in FIG. 11 will be described. The present embodiment is different from the first embodiment in that three types of power source area I/O pads, that is, VDD1 area I/O pads (symbols V1 in the figure) 1101, VDD2 area I/O pads (symbols V2 in the figure) 1102, and GND area I/O pads 104 are provided. This applies to the case, for example, where high-voltage power sources for analog use and digital use are provided, or where other high-voltage power sources for general use and for substrates are provided.

As illustrated in the figure, in three columns and three rows in a peripheral portion P of a gate region G of a chip 101, different power source area I/O pads are sequentially aligned both in a row direction and in a column direction. That is, both in the row direction and in the column direction, the VDD1 area I/O pads 1101, the VDD2 area I/O pads 1102, and the GND area I/O pads 104 are alternately aligned. Moreover, a layout in a center portion M of the gate region G of the chip 101, that is, in portions of the gate region G except for the peripheral portion P is such that the same power source area I/O pads are aligned in the row direction, and different power source area I/O pads are sequentially aligned in the column direction. That is, the VDD1 area I/O pads 1101, the VDD2 area I/O pads 1102, or the GND area I/O pads 104 are successively aligned in the row direction, and the VDD1 area I/O pads 1101, the VDD2 area I/O pads 1102, and the GND area I/O pads 104 are sequentially aligned in the column direction.

With this power source area I/O pad layout, in the same manner as in the first embodiment, the voltage drops can be reduced both in the center portion M and the peripheral portion P of the gate region G.

Although the peripheral portion P of the gate region G in the example of FIG. 11 includes three columns and three rows in which three types of pads are sequentially arranged, the number of columns and/or the number of rows in the peripheral portion P of the gate region G can be changed if the layout is changed so that the voltage drops across the peripheral portion P and the center portion M of the gate region G are optimally reduced.

Third Embodiment

A third embodiment of the present invention will be described below with reference to the drawings.

Figure 12:
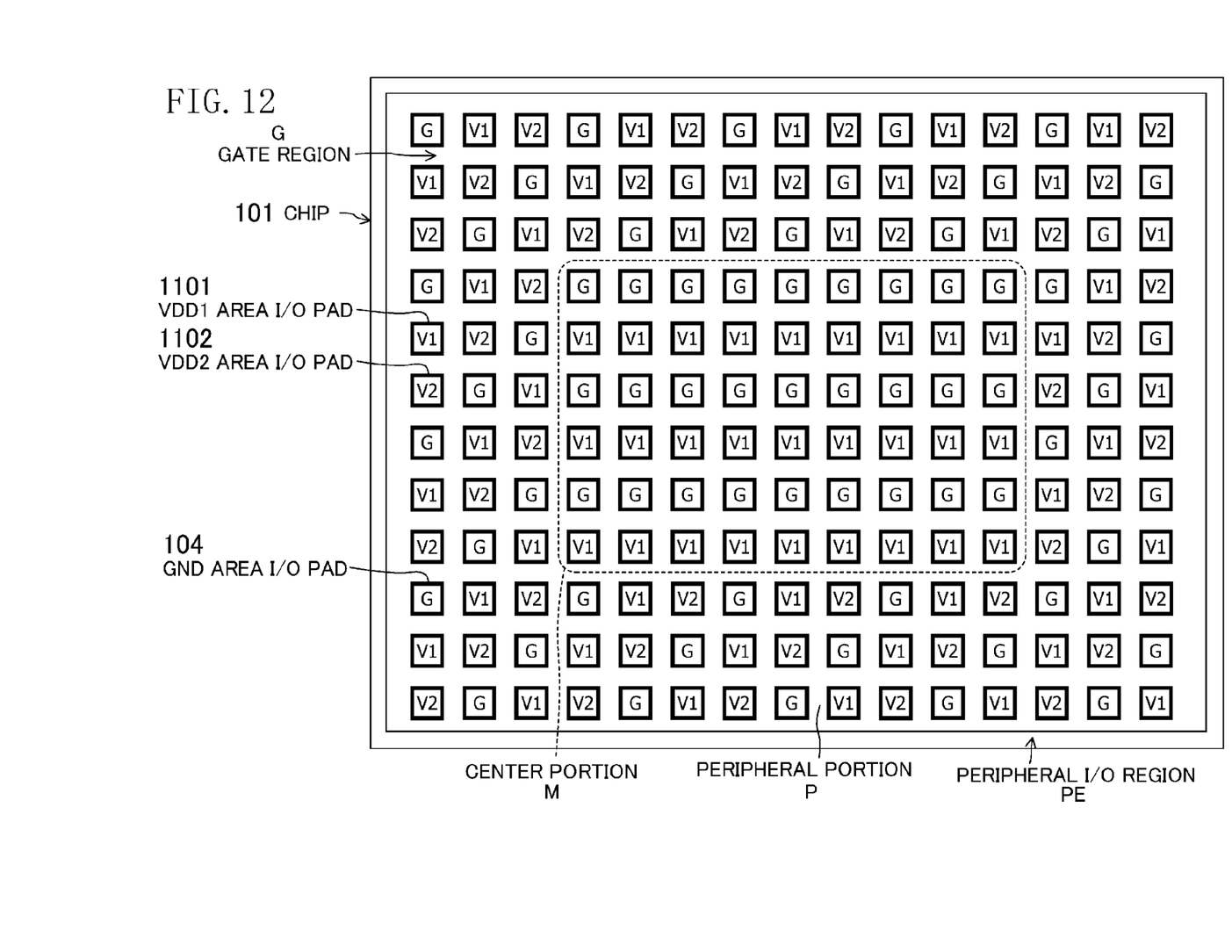
FIG. 12 is a view illustrating a power source area I/O pad layout of a third embodiment of the semiconductor integrated circuit device of the present invention.

FIG. 12 is a view illustrating the third embodiment of an area I/O pad layout of a semiconductor integrated circuit device of the present invention. Here, attention is directed to the arrangement of power source area I/O pads, and thus signal area I/O pads are not illustrated in the figure.

A power source area I/O pad layout illustrated in FIG. 12 will be described. As illustrated in the figure, in three columns and three rows in a peripheral portion P of a gate region G of a chip 101, different power source area I/O pads are sequentially aligned both in a row direction and in a column direction. That is, both in the row direction and in the column direction, VDD1 area I/O pads 1101, VDD2 area I/O pads 1102, and GND area I/O pads 104 are alternately aligned. Moreover, a layout in a center portion M of the gate region G of the chip 101, that is, in portions of the gate region G except for the peripheral portion P is such that the same power source area I/O pads are aligned in the row direction, and different power source area I/O pads are sequentially aligned in the column direction. That is, the VDD1 area I/O pads 1101 or the GND area I/O pads 104 are successively aligned in the row direction, and the VDD1 area I/O pads 1101 and the GND area I/O pads 104 are sequentially aligned in the column direction.

With this power source area I/O pad layout, in the same manner as in the first embodiment, the voltage drops across both the center portion M and the peripheral portion P of the gate region G can be reduced.

The present embodiment is different from the second embodiment in that the VDD2 area I/O pads 1102 are provided only in the peripheral portion P of the gate region G of the chip 101. For example, in the case where blocks to which power is supplied via the VDD2 area I/O pads 1102 are provided only at the periphery of the gate region G, the VDD2 area I/O pads 1102 are arranged only in the peripheral portion P of the gate region G, so that the number of VDD1 area I/O pads 1101 arranged in the center portion M of the gate region G increases, thereby optimally reducing the voltage drop as a whole. Note that the layout is not limited to the example of the present embodiment. In the case where blocks to which power is supplied via the VDD2 area I/O pads 1102 are provided only in the center portion of the gate region G, a layout which is a reversal of the above-described layout may be used.

Although the peripheral portion P of the gate region G in the example of FIG. 12 includes three columns and three rows in which three types of pads are sequentially arranged, the number of columns and/or the number of rows in the peripheral portion P of the gate region G can be changed if the layout is changed so that the voltage drops across the peripheral portion P and the center portion M of the gate region G are optimally reduced.

Fourth Embodiment

A fourth embodiment of the present invention will be described below with reference to the drawings.

Figure 13:
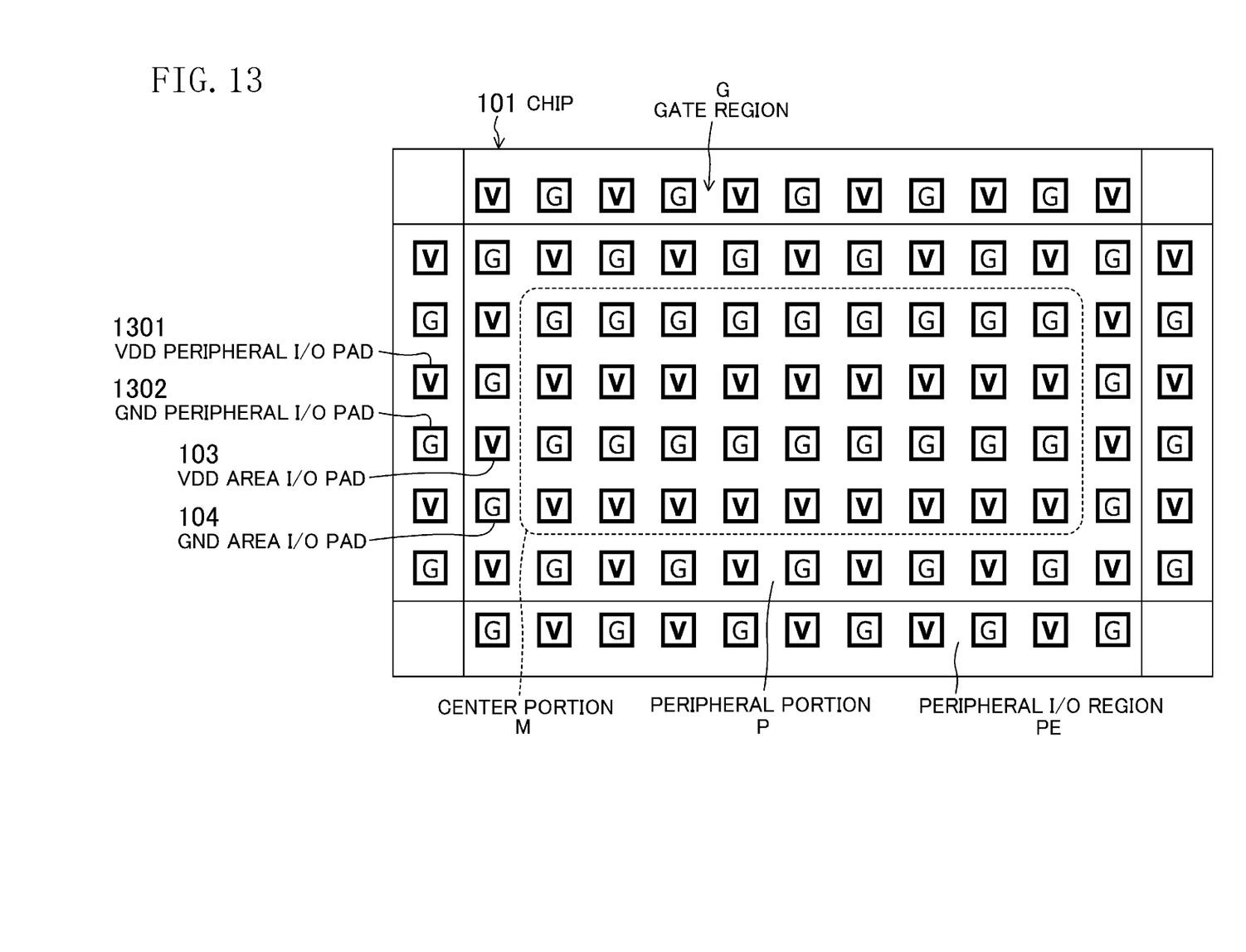
FIG. 13 is a view illustrating a layout of power source peripheral I/O pads and power source area I/O pads of a fourth embodiment of the semiconductor integrated circuit device of the present invention.

FIG. 13 is a view illustrating the fourth embodiment of an area I/O pad layout of a semiconductor integrated circuit device of the present invention. Here, attention is directed to the arrangement of power source peripheral I/O pads and power source area I/O pads, and thus signal peripheral I/O pads and signal area I/O pads are not illustrated in the figure.

The layout of the power source peripheral I/O pads illustrated in FIG. 13 will be described. As illustrated in the figure, in a peripheral I/O region PE located at an outer circumference of a peripheral portion P of a gate region G, VDD peripheral I/O pads 1301 and GND peripheral I/O pads 1302 are alternately arranged. Next, a power source area I/O pad layout will be described. As illustrated in the figure, in a column and a row of the peripheral portion P of the gate region G, different power source area I/O pads are alternately arranged both in a row direction and in a column direction. Moreover, with respect to the relationship of the power source area I/O pads to the adjacent power source peripheral I/O pads, the VDD peripheral I/O pads 1301 are each aligned to be adjacent to a GND area I/O pad 104, or the GND peripheral I/O pads 1302 are each aligned to be adjacent to a VDD area I/O pad 103. That is, both in the row direction and in the column direction, the area I/O pads connected to a high-voltage power source VDD or the peripheral I/O pads, and the peripheral I/O pads connected to a ground power source GND or the area I/O pads are alternately aligned. Moreover, a layout in a center portion M of the gate region G, that is, in portions of the gate region G except for the peripheral portion P is such that the same power source area I/O pads are aligned in the row direction, and different power source area I/O pads are alternately aligned in the column direction. That is, the VDD area I/O pads 103 or the GND area I/O pads 104 are successively aligned in the row direction, and the VDD area I/O pads 103 and the GND area I/O pads 104 are alternately aligned in the column direction.

With this power source area I/O pad layout, in the same manner as in the first embodiment, the power source layout of FIG. 2 is used in the center portion M of the gate region G, and thus the voltage drop can be reduced in the center portion M, and the power source layout of FIG. 3 is used in the peripheral portion P of the gate region G, and thus the voltage drop can be reduced in the peripheral portion P.

Although the peripheral portion P of the gate region G of the example of FIG. 13 includes two columns and two rows in which the peripheral I/O pads are included, that is, the area I/O pads are in one row and one column, the number of columns and/or the number of rows in the peripheral portion P of the gate region G can be changed if the layout is changed so that the voltage drops across the peripheral portion P and the center portion M of the gate region G are optimally reduced.

In the present embodiment, there are two types of the power source peripheral I/O pads and the power source area I/O pads which are connected to the high-voltage power source VDD and the ground power source GND, but even when three or more types thereof are provided, the same advantages can, of course, be obtained when they are arranged as in the second embodiment, or in the third embodiment.

As described above, in the semiconductor integrated circuit device of the present invention, the layout of the power source area I/O pads differs between the center portion of the gate region of the chip and the peripheral portion of the gate region of the chip, so that voltage drops across any positions of the gate region of the chip can effectively be reduced, which can alleviate the performance degradation of the chip. Thus, the semiconductor integrated circuit device of the present invention is useful in designing semiconductor integrated circuit devices having power source area I/O pads.

What is claimed is:

1. A semiconductor integrated circuit device comprising:
a peripheral I/O region in which I/O cells are arranged;
a gate region surrounded by the peripheral I/O region;
a plurality of power area pads arranged in the gate region; and
first and second power source lines, wherein:
the plurality of power area pads are arranged in a matrix along a raw direction and a column direction, and include first power area pads connected to the first power source line and second power area pads connected to the second power source line,
the gate region comprises a peripheral portion and a center portion, the peripheral portion being adjacent to the peripheral I/O region and the center portion being not adjacent to the peripheral I/O region,
the plurality of power area pads in the peripheral portion is arranged such that the first power area pads and the second power area pads are alternately disposed in a direction of a boundary between the peripheral I/O region and the peripheral portion of the gate region, and
the plurality of power area pads in the center portion include at least one row or column that includes either (i)

only the first power area pads or (ii) only the second power area pads, as the power area pads.

2. The semiconductor integrated circuit device of claim 1, wherein
the first power area pads connected to the first power source line and the second power area pads connected to the second power source line are alternately arranged, in at least two rows or two columns, both in the row direction and in the column direction in the peripheral portion of the gate region.

3. The semiconductor integrated circuit device of claim 1, wherein:
the first power source line is connected to a high-voltage power source, and
the second power source line is connected to a ground power source.

4. The semiconductor integrated circuit device of claim 1, wherein:
the second power area pads are composed of first-second power area pads connected to the second power source line and second-second power area pads connected to a third power source line, and
the plurality of power area pads in the center portion include at least one row or column that includes either (a) only the first power area pads, (b) only the first-second power area pads or (c) only the second-second power area pads, as the power area pads.

5. The semiconductor integrated circuit device of claim 4, wherein the center portion of the gate region includes either (1) only the first-second power area pads or (2) only the second-second power area pads, as the power area pads.

6. The semiconductor integrated circuit device of claim 1, further comprising:
a plurality of peripheral I/O pads arranged in the peripheral I/O region.

7. The semiconductor integrated circuit device of claim 1, further comprising:
a plurality of signal pads disposed between the plurality of power area pads.

8. The semiconductor integrated circuit device of claim 4, wherein
the first power area pads connected to the first power source line and the second power area pads connected to the second power source line are alternately arranged, in at least two rows or two columns, both in the row direction and in the column direction in the peripheral portion of the gate region.

9. The semiconductor integrated circuit device of claim 4, wherein:
the first power source line is connected to a high-voltage power source, and
the second power source line is connected to a ground power source.

10. The semiconductor integrated circuit device of claim 4, further comprising:
a plurality of peripheral I/O pads arranged in the peripheral I/O region.

11. The semiconductor integrated circuit device of claim 4, further comprising:
a plurality of signal pads disposed between the plurality of power area pads.

* * * * *